(12) United States Patent
Shimizu

(10) Patent No.: US 9,000,554 B2
(45) Date of Patent: Apr. 7, 2015

(54) SEMICONDUCTOR DEVICE

(71) Applicant: Mitsubishi Electric Corporation, Toyko (JP)

(72) Inventor: Kazuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/252,649

(22) Filed: Apr. 14, 2014

(65) Prior Publication Data

US 2015/0061070 A1     Mar. 5, 2015

(30) Foreign Application Priority Data

Aug. 29, 2013   (JP) ................................. 2013-178144

(51) Int. Cl.
*H01L 29/00*     (2006.01)
*H01L 29/06*     (2006.01)

(52) U.S. Cl.
CPC ................................. *H01L 29/0649* (2013.01)

(58) Field of Classification Search
USPC ................................. 257/500, 506, 501, 532
See application file for complete search history.

(56) References Cited

U.S. PATENT DOCUMENTS

| | | | |
|---|---|---|---|
| 3,798,608 | A | 3/1974 | Huebner |
| 6,087,882 | A | 7/2000 | Chen et al. |
| 6,873,065 | B2 | 3/2005 | Haigh et al. |
| 2007/0013022 | A1 | 1/2007 | Shimizu |

FOREIGN PATENT DOCUMENTS

| | | |
|---|---|---|
| JP | H10-116981 A | 5/1998 |
| JP | H11-251319 A | 9/1999 |
| JP | 2001-519096 A | 10/2001 |
| JP | 2003-229488 A | 8/2003 |
| JP | 2005-108874 A | 4/2005 |
| JP | 2007-027358 A | 2/2007 |
| JP | 2011-238760 A | 11/2011 |
| WO | 98/43292 A1 | 10/1998 |

*Primary Examiner* — Long Pham
(74) *Attorney, Agent, or Firm* — Studebaker & Brackett PC

(57) ABSTRACT

A first isolation trench insulates and separates a low-voltage region, a high-voltage region, and a connection region of the semiconductor layer from each other. A low-potential signal processing circuit is in the low-voltage region, and operates at a lower potential. A high-potential signal processing circuit is in the high-voltage region, and operates at a higher potential. A capacitor is on the connection region and transmits the second alternating current signal from the low-potential signal processing circuit to the high-potential signal processing circuit. The capacitor includes a low-potential electrode connected to the low-potential signal processing circuit, and a high-potential electrode connected to the high-potential signal processing circuit. First wiring layers of the low-potential electrode and second wiring layers of the high-potential electrode are capacitively coupled. Side wall surfaces of the first wiring layers and those of the second wiring layers are opposed to each other.

15 Claims, 14 Drawing Sheets

CHIP SIDE ◄─┼─► DICING LINE SIDE

CHIP SIDE ◄─┼─► DICING LINE SIDE

CHIP SIDE ←|→ DICING LINE SIDE

CHIP SIDE ←|→ DICING LINE SIDE

CHIP SIDE ←|→ DICING LINE SIDE

CHIP SIDE ←|→ DICING LINE SIDE

SEMICONDUCTOR DEVICE

BACKGROUND OF THE INVENTION

1. Field of the Invention

The present invention relates to a semiconductor device for controlling a power semiconductor element to which a high voltage of several hundred volts is applied.

2. Background Art

As a kind of semiconductor device for controlling a power semiconductor element to which a high voltage of several hundred volts is applied, a device is known that has a low-potential signal processing circuit and a high-potential signal processing circuit, and that realizes signal transmission by means of an alternating current electric field between the low-potential signal processing circuit and the high-potential signal processing circuit connected to each other through a capacitor, between which a large potential difference is produced. In such a conventional semiconductor device, the low-potential signal processing circuit and the high-potential signal processing circuit are formed in separate chips: a chip on the low-voltage side and a chip on the high-voltage side. The capacitor is formed by an interlayer insulating film formed on the chip on the high-voltage side and electrodes sandwiching the interlayer insulating film. The low-potential signal processing circuit and the capacitor are connected to each other by a wire (see, for example, U.S. Pat. No. 6,873,065).

SUMMARY OF THE INVENTION

Silicon oxide film is ordinarily formed as interlayer insulating film by CVD or the like at a low temperature. The insulation withstand capacity per film thickness of an interlayer insulating film formed in such a way is smaller than that of a thermal oxide film such as a field oxide film. There is, therefore, a need to form on the chip a thick interlayer insulating film capable of withstanding the potential difference between the low-voltage side and the high-voltage side. For example, in the case of obtaining an insulation withstand voltage of 4.0 kVrms equal to that of a photocoupler, it is necessary to increase the film thickness of the interlayer insulating film to 15 µm or more. If the thickness of the interlayer insulating film is increased, the capacitance of the capacitor is reduced and, therefore, a need arises to increase the area of the electrodes in order to obtain the desired capacitance, resulting in an increase in chip area. Also, a process must be prepared in which the film thickness of the interlayer insulating film is changed according to the required withstand voltage. Moreover, two chips on the low-voltage and high-voltage sides are required. Thus, there has been a problem that the manufacturing cost is high.

On the other hand, the lengths of wires for performing signal transmission between the low-voltage-side chip and the high-voltage-side chip are increased with increase in chip spacing. Ordinary assembly techniques require a chip spacing of 1 mm or more. Lengths of wires larger than this value are required and wires having lengths of 2 to 5 mm are ordinarily required. These lengths are one or more orders of magnitude larger than those of pieces of wiring formed in IC chips. Therefore, the interwiring capacitance and parasitic inductance produced between the wires are increased, crosstalk and noise occur easily and the occurrence of malfunctions is increased. Also, due to interference between the wires and external electromagnetic noise, signal errors occur easily and the operation is unstable.

The present invention has been achieved to solve the above-described problems, and an object of the present invention is to provide a semiconductor device that can be manufactured at a reduced cost and can operate with improved stability.

According to the present invention, a semiconductor device includes: a substrate including an insulating layer; a semiconductor layer on the insulating layer and including a low-voltage region, a high-voltage region, and a connection region; a first isolation trench insulating and separating the low-voltage region, the high-voltage region, and the connection region from each other; a low-potential signal processing circuit in the low-voltage region, operating at a first potential, processing an inputted first signal, and outputting a second alternating current signal; a high-potential signal processing circuit in the high-voltage region, operating at a second potential higher than the first potential, processing the second alternating current signal, and outputting a third signal; and a capacitor on the connection region and transmitting the second alternating current signal from the low-potential signal processing circuit to the high-potential signal processing circuit, wherein the capacitor includes a low-potential electrode connected to the low-potential signal processing circuit, and a high-potential electrode connected to the high-potential signal processing circuit, the low-potential electrode includes a plurality of first wiring layers which are stacked, the high-potential electrode includes a plurality of second wiring layers which are stacked, the first wiring layers and the second wiring layers are capacitively coupled, and side wall surfaces of the first wiring layers and side wall surfaces of the second wiring layers are opposed to each other.

The present invention makes it possible to provide a semiconductor device that can be manufactured at a reduced cost and can operate with improved stability.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
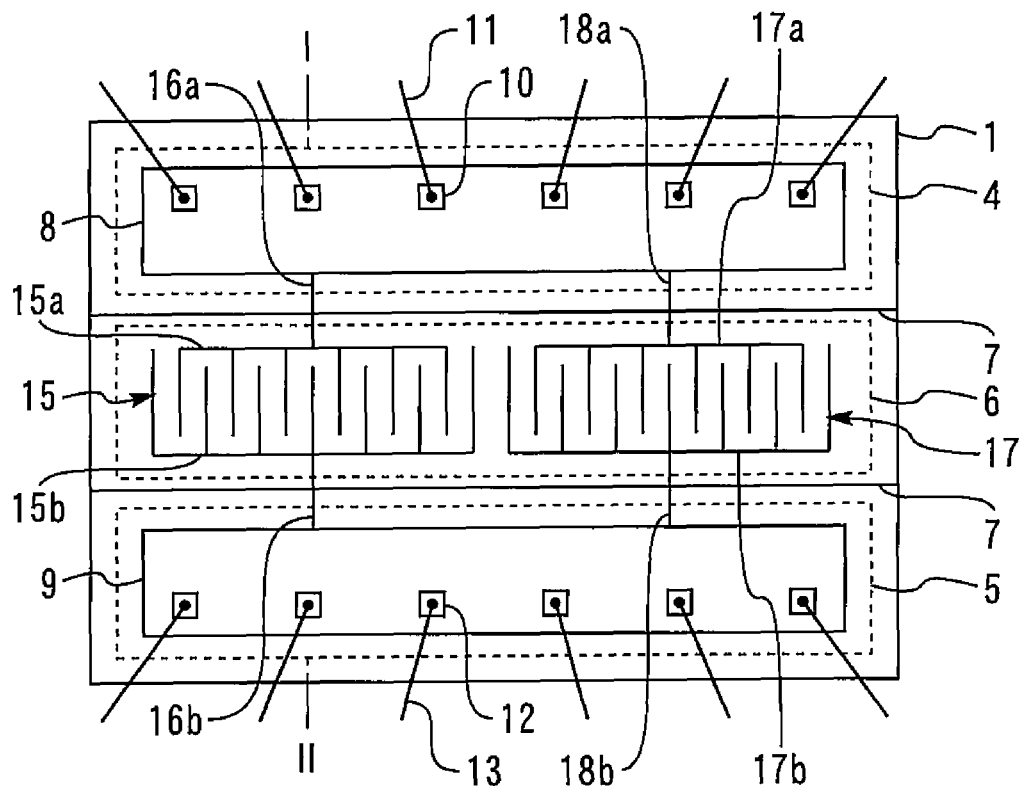
FIG. 1 is a plan view of a semiconductor device according to a first embodiment of the present invention.
Figure 2:
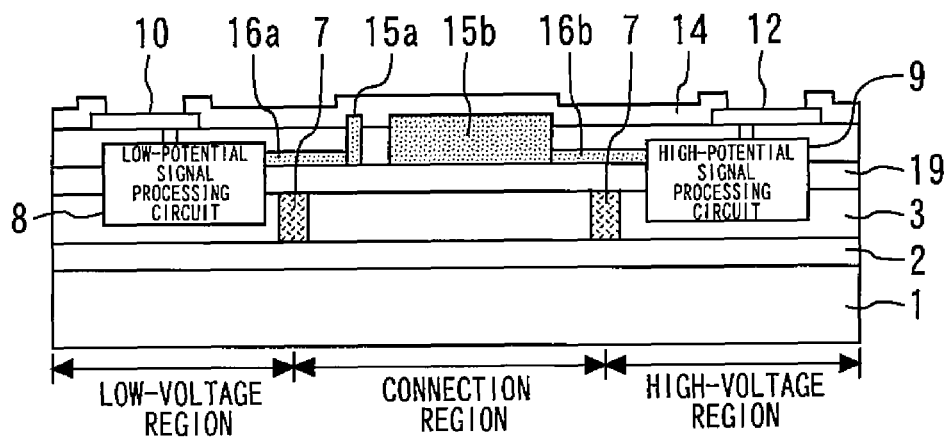
FIG. 2 is a sectional view taken along line I-II in FIG. 1.

FIG. 1 is a plan view of a semiconductor device according to a first embodiment of the present invention. FIG. 2 is a sectional view taken along line I-II in FIG. 1. A buried oxide film 2 is provided on the upper end side of a support substrate 1 made of single crystal silicon for example, and an active silicon layer 3 is provided on the buried oxide film 2. The support substrate 1, the buried oxide film 2 and the active silicon layer 3 constitute a silicon on insulator (SOI) substrate.

The active silicon layer 3 has a low-voltage region 4, a high-voltage region 5, and a connection region 6. The connection region 6 is placed between the low-voltage region 4 and the high-voltage region 5. An isolation trench 7 electrically insulates the low-voltage region 4, the high-voltage region 5 and the connection region 6 from each other.

A low-potential signal processing circuit 8 is provided in the low-voltage region 4, processes a first signal supplied from the outside for example, and outputs a second alternating current signal. A high-potential signal processing circuit 9 is provided in the high-voltage region 5, operates at a potential higher than that at which the low-voltage signal processing circuit 8 operates. The high-potential signal processing circuit 9 processes the second alternating current signal and outputs a third signal for driving an external power semiconductor element (e.g., an IGBT or a power MOSFET).

Wires 11 are bonded to pads 10 for the low-potential signal processing circuit 8 and are electrically connected to an external circuit. Wires 13 are bonded to pads 12 for the high-potential signal processing circuit 9 and are electrically connected to the external power semiconductor element. A surface protective film 14 covers the chip surface and has openings at the pads 10 and 12.

Capacitors 15 and 17 are provided on the connection region 6 to transmit the second alternating current signal from the low-potential signal processing circuit 8 to the high-potential signal processing circuit 9. The capacitor 15 is a pair of electrodes opposed to each other: a low-potential electrode 15a connected to the low-potential signal processing circuit 8 through wiring 16a and a high-potential electrode 15b connected to the high-potential signal processing circuit 9 through wiring 16b. The capacitor 17 is a pair of electrodes opposed to each other: a low-potential electrode 17a connected to the low-potential signal processing circuit 8 through wiring 18a and a high-potential electrode 17b connected to the high-potential signal processing circuit 9 through wiring 18b. The low-potential electrodes 15a and 17a and high-potential electrodes 15b and 17b are spaced apart from each other by a certain distance in order to obtain a high insulation withstand capacity and are electrically connected to each other by capacitive coupling to enable transmission of signals.

Figure 3:
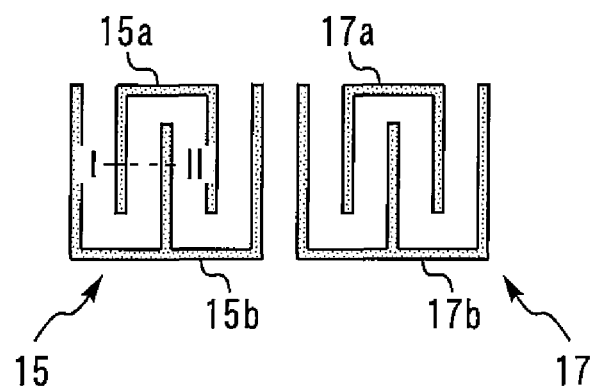
FIG. 3 is a plan view of the capacitors according to the first embodiment of the present invention.

FIG. 3 is a plan view of the capacitors according to the first embodiment of the present invention. The low-potential electrodes 15a and 17a are spaced apart from each other and the high-potential electrodes 15b and 17b are also spaced part from each other. The low-potential electrodes 15a and 17a and the high-potential electrodes 15b and 17b are each a member in comb form having a plurality of teeth as viewed in plan. The numbers of teeth of the high-potential electrodes 15b and 17b are larger by one then those of teeth of the low-potential electrodes 15a and 17a. The teeth of the low-potential electrodes 15a and 17a are wrapped with the high-potential electrodes 15b and 17b in three directions other than the direction in which they face the low-potential signal processing circuit 8, as viewed in plan (being opposed at their three sides to the high-potential electrodes 15b and 17b).

Figure 4:
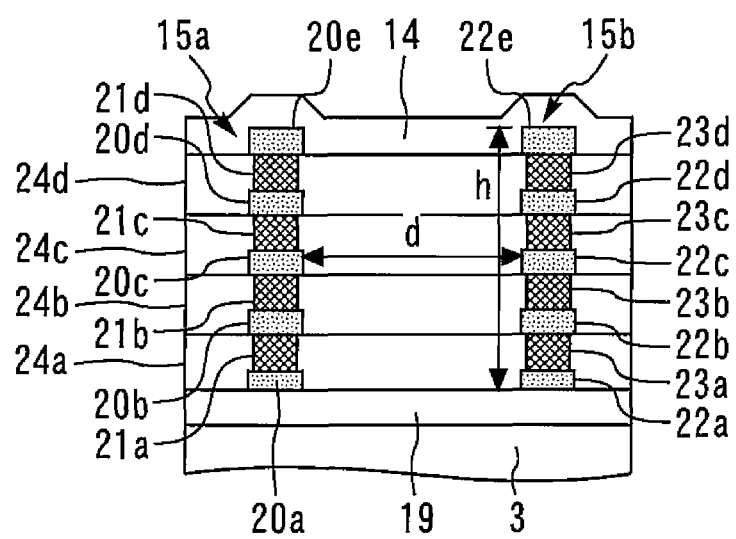
FIG. 4 is a sectional view taken along line I-II in FIG. 3.

FIG. 4 is a sectional view taken along line I-II in FIG. 3. While description of the structure of the low-potential electrode 15a and the high-potential electrode 15b is made below, the same description applies to the low-potential electrode 17a and the high-potential electrode 17b.

The low-potential electrode 15a is a multilayer wiring structure having first to fifth wiring layers 20a to 20e stacked on the active silicon layer 3 with oxide film 19 interposed therebetween, and conductor portions 21a to 21d connecting the wiring layers 20a to 20e one to another. The high-potential electrode 15b is a multilayer wiring structure having first to fifth wiring layers 22a to 22e stacked on the active silicon layer 3 with oxide film 19 interposed therebetween, and conductor portions 23a to 23d connecting the wiring layers 22a to 22e one to another. The interlayer insulating films 24a to 24d are respectively formed between the wiring layers 20a to 20d and the wiring layers 22a to 22d. The plurality of wiring layers 20a to 20e (and the conductor portions 21a to 21d) and the plurality of wiring layers 22a to 22e (and the conductor portions 23a to 23d) are capacitively coupled by having their side wall surfaces opposed to each other.

If the height from the bottoms of the first wiring layers 20a and 23a to the tops of the fifth wiring layers 20e to 23e is h; the spacing between the low-potential electrode 15a and the high-potential electrode 15b is d; the total creeping distance of opposition between the low-potential electrode 15a and the high-potential electrode 15b is L; and the dielectric constant of the interlayer insulating films 24a to 24d is ∈, the electrostatic capacitance C produced between the low-potential electrode 15a and the high-potential electrode 15b is expressed by the following equation (1):

$$C = \in \cdot h \cdot L / d \qquad (1)$$

The capacitance value C necessary for performing signal transmission between the low-voltage side and the high-voltage side can be set with the values of h, L and d. The electrode spacing d is determined by the required insulation withstand voltage between the electrodes (a design value of the insulation withstand voltage with respect to the potential difference produced between the low-voltage side and the high-voltage side).

In the present embodiment, the withstand voltage between the low-potential electrodes 15a and 17a and the high-potential electrodes 15b and 17b can be adjusted through the electrode spacing d. Changing the film thickness of the interlayer insulating film according to the desired withstand voltage is not required. As a result, the desired capacitance can be obtained by using the same manufacturing process. The low-potential signal processing circuit 8 and the high-potential signal processing circuit 9 differing in operating potential are electrically separated from each other by the isolation trench 7 and oxide film 19. Therefore, the manufacturing cost can be reduced in comparison with the related device constituted by two chips.

There is no need to make a wire connection between the low-voltage side and the high-voltage side such as that in the related art. Therefore, the interwiring capacitance and parasitic inductance are made markedly small, thus preventing a malfunction due to crosstalk or noise and improving the operation stability.

The low-potential electrode 15a is wrapped with the high-potential electrode 15b in three directions. Therefore, capacitive coupling to the high-potential electrode 17b can be prevented. As a result, a malfunction due to crosstalk can be prevented. Similarly, the low-potential electrode 17a is wrapped with the high-potential electrode 17b in three directions other than the direction in which it faces the low-potential signal processing circuit 8, as viewed in plan. Therefore, capacitive coupling to the high-potential electrode 15b can be prevented.

It is preferred that the width of the wiring layers 20a to 20e be equal to the width of the conductor portions 21a to 21d, and that the width of the wiring layers 22a to 22e be equal to the width of the conductor portions 23a to 23d. By equalizing these widths, the side wall surfaces of the low-potential electrodes 15a and 17a and the high-potential electrodes 15b and 17b with projections and recesses can be made close to flat surfaces. In the case where projections exist in the side wall surfaces of the low-potential electrodes 15a and 17a and the high-potential electrodes 15b and 17b, the electric field is concentrated thereon. The electric field concentration can be moderated by making the side wall surfaces with projections and recesses close to flat surfaces.

Second Embodiment

Figure 5:
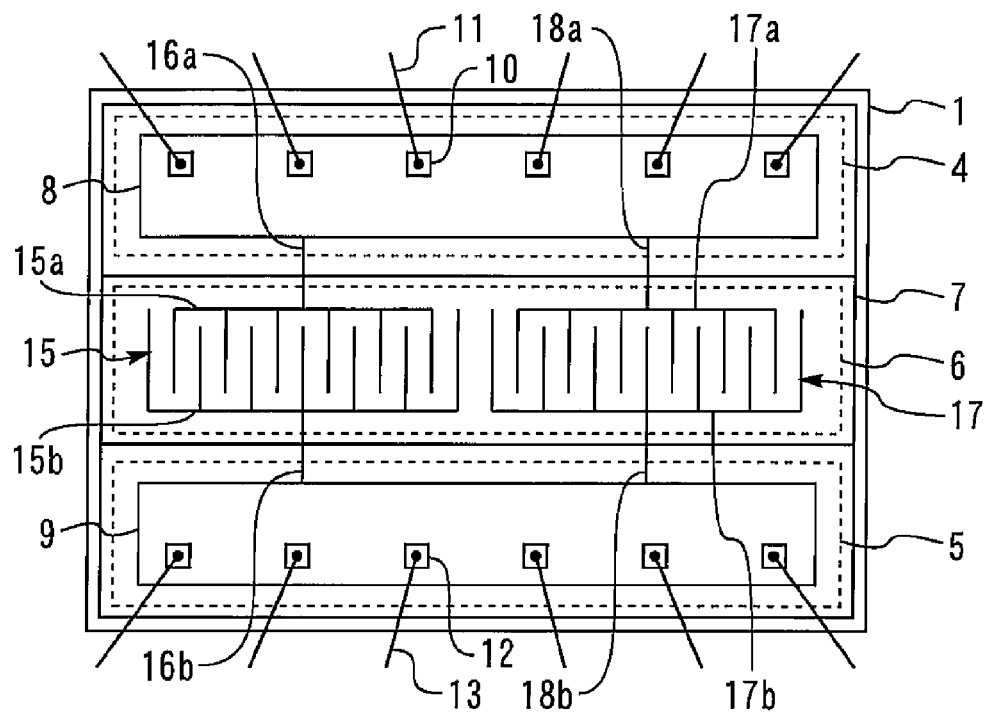
FIG. 5 is a plan view of a semiconductor device according to a second embodiment of the present invention.

FIG. 5 is a plan view of a semiconductor device according to a second embodiment of the present invention. An isolation trench 7 completely surrounds each of the low-voltage region 4, the high-voltage region 5 and the connection region 6. The insulation of each region is thereby enhanced. In particular, even when partial failure of isolation by the isolation trench 7 occurs in actual manufacturing, a certain insulation effect can be maintained, thus preventing a reduction in yield and achieving a reduction in manufacturing cost.

Third Embodiment

Figure 6:
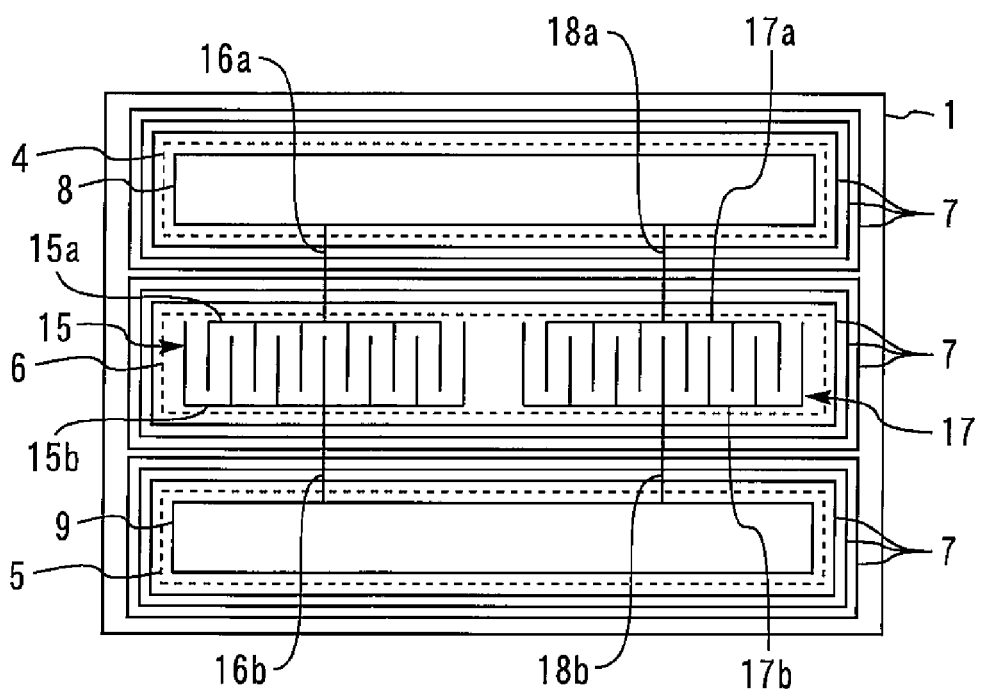
FIG. 6 is a plan view of a semiconductor device according to a third embodiment of the present invention.

FIG. 6 is a plan view of a semiconductor device according to a third embodiment of the present invention. A plurality of isolation trenches 7 multiplied as viewed in plan (triple isolation in the present embodiment) are provided.

Figure 7:
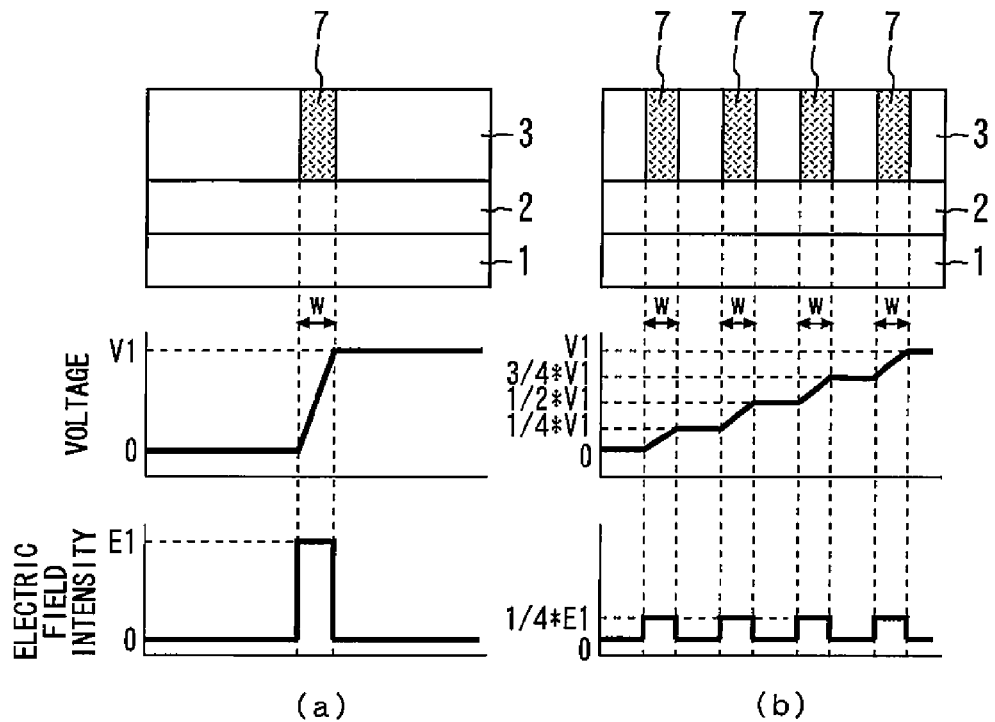
FIG. 7 is a diagram showing a structure for single trench isolation (a), a structure for quadruple trench isolation (b), and voltage distributions and electric field distributions in the structures.

FIG. 7 is a diagram showing a structure for single trench isolation (a), a structure for quadruple trench isolation (b), and voltage distributions and electric field distributions in the structures. With each structure, isolation for a potential difference of 600 V is achieved. In the case of single trench isolation, a large electric field is locally produced and there is a possibility of discharge at the surface and insulation breakdown. In the case of isolation by the plurality of isolation trenches, the voltage lowers in steps; therefore, a large electric field is not locally produced; and the occurrence of a fault such as surface discharge can be prevented.

Fourth Embodiment

Figure 8:
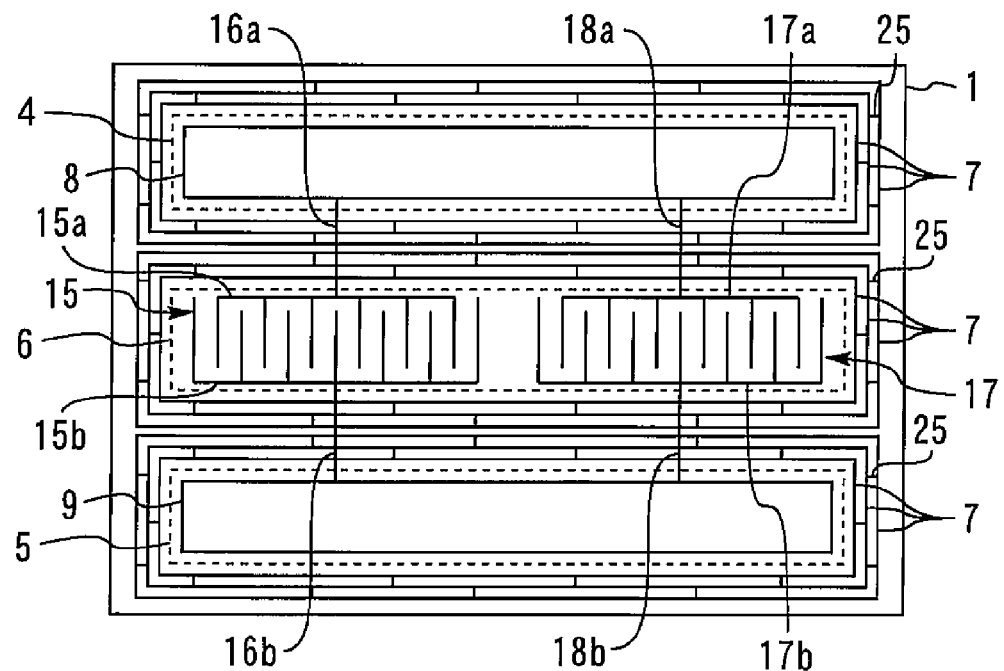
FIG. 8 is a plan view of a semiconductor device according to a fourth embodiment of the present invention.

FIG. 8 is a plan view of a semiconductor device according to a fourth embodiment of the present invention. In the third embodiment, the active silicon layer 3 between each adjacent pair of isolation trenches 7 has a uniform potential and, therefore, the active silicon layer 3 has capacitive couplings across the isolation trenches along the entire periphery of each region. Therefore, when a steep potential difference occurs on some one of the regions, noise such as a displacement current due to the capacitive coupling across the isolation trenches 7 is generated. In the present embodiment, therefore, isolation trenches 25 separate the active silicon layer 3 between each adjacent pair of isolation trenches 7 into a plurality of sections in an insulating manner. Thereby, capacitive couplings are not made across the isolation trenches along the entire periphery of each region, thus reducing displacement currents.

Fifth Embodiment

Figure 9:
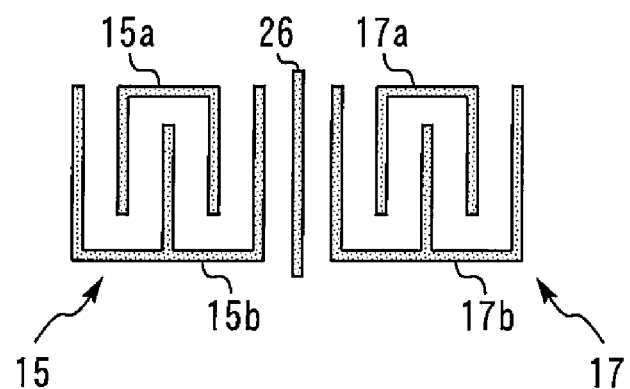
FIG. 9 is a plan view of capacitors according a fifth embodiment of the present invention.

FIG. 9 is a plan view of capacitors according a fifth embodiment of the present invention. A shielding electrode 26 connected to a fixed potential is disposed between the capacitor 15 and the capacitor 17. The shielding electrode 26 uses the same structure (section) as that of the low-potential electrode 15a and other similar electrodes, performs shielding against signal electric fields respectively produced in the capacitors 15 and 17, and is therefore capable of preventing a malfunction due to interference between the signal electric fields. It is desirable to set the potential on the shielding electrode 26 to a virtual ground potential on the same potential side as the low-potential electrode 15a or the low-potential electrode 17a, because the potential is stabilized thereby.

Sixth Embodiment

Figure 10:
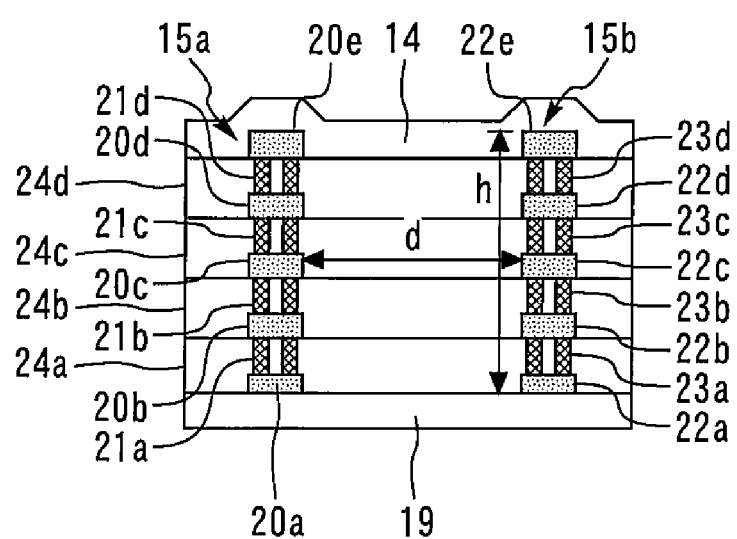
FIG. 10 is a sectional view of a capacitor according to a sixth embodiment of the present invention.

FIG. 10 is a sectional view of a capacitor according to a sixth embodiment of the present invention. In the sixth embodiment, each of conductor portions 21a to 21d and conductor portions 23a to 23d is divided into a plurality of portions disposed side by side. The plurality of conductor portions 21a to 21d are disposed at least at opposite ends of the wiring layers 20a to 20e in the width direction, and the plurality of conductor portions 23a to 23d are disposed at least at opposite ends of the wiring layers 22a to 22e in the width direction.

Each of the conductor portions 21a to 21d and 23a to 23d is ordinarily a tungsten plug formed by embedding tungsten in a via hole (in linear form) of 0.5 μm or less formed in each of the interlayer insulating films 24a to 24d. In an ordinarily case of forming a tungsten plug, the with of the tungsten plug is at most about 0.5 μm. Therefore, if the width of the wiring layers 20a to 20e and 22a to 22e and the width of the conductor portions 21a to 21d and 23a to 23d are equalized, the width of the wiring layers 20a to 20e and 22a to 22e is limited to 1.0 µm or less. In this case, if a layout in which the length (total creeping distance) L of opposition between the low-potential electrodes 15a and 17a and the high-potential electrodes 15b and 17b is increased to increase the capacitance C is made, each piece of wiring is increased in length and the resistance value R is increased. An equivalent circuit for the capacitors 15 and 17 is not a simple circuit of the capacitance value C but a distributed constant circuit of the capacitance value C and the resistance value R. Therefore, the gain at which a signal is transmitted by capacitive coupling is reduced when the resistance value is increased.

In the present embodiment, therefore, each of the conductor portions 21a to 21d and 23a to 23d has a plurality of plugs respectively disposed on a plurality of regions of the wiring layers 20a to 20e and 22a to 22e including opposite ends of these layers in the width direction. This construction ensures that the width of the wiring layers 20a to 20e and 22a to 22e can be set without being limited to the width of the conductor portions 21a to 21d and 23a to 23d, while the increase in resistance is limited. The width of the wiring layers 20a to 20e and 22a to 22e can therefore be increased, thus enabling reducing the parasitic resistances of the capacitors 15 and 17.

Seventh Embodiment

Figure 11:
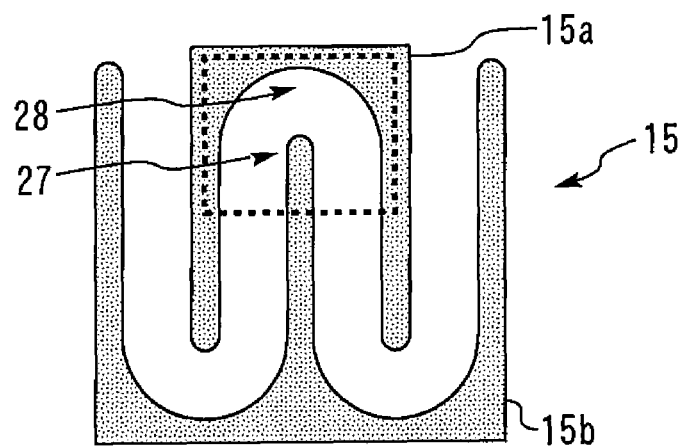
FIG. 11 is a plan view of a capacitor according to a seventh embodiment of the present invention.
Figure 12:
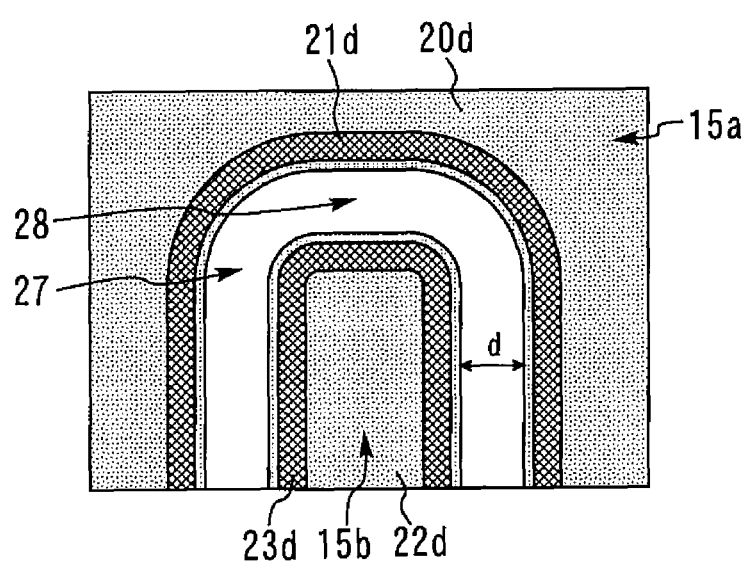
FIG. 12 is an enlarged plan view of a portion surrounded by the broken line in FIG. 11.

FIG. 11 is a plan view of a capacitor according to a seventh embodiment of the present invention. FIG. 12 is an enlarged plan view of a portion surrounded by the broken line in FIG. 11, illustrating an example of a case of using the structure according to the sixth embodiment (FIG. 10). The high-potential electrode 15b has a cornered portion 27 while the low-potential electrode 15a has a recessed portion 28 facing the cornered portion 27. The cornered portion 27 and the recessed portion 28 are concentrically rounded as viewed in plan. A reduction in insulation withstand capacity can be prevented by limiting electric field concentration on the cornered portion 27 in this way. The capacitance value can also be increased since the distance d between the electrodes can be made constant.

Eighth Embodiment

Figure 13:
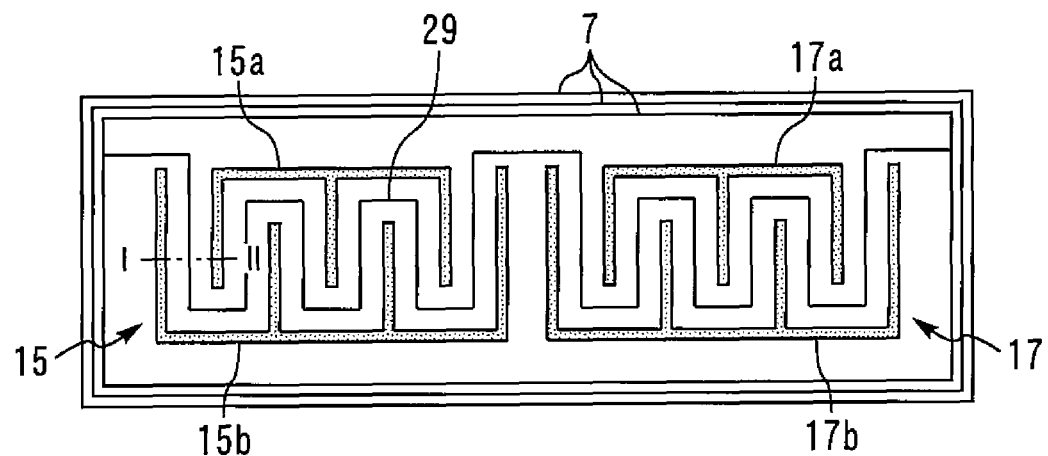
FIG. 13 is a plan view of capacitors according to an eighth embodiment of the present invention.
Figure 14:
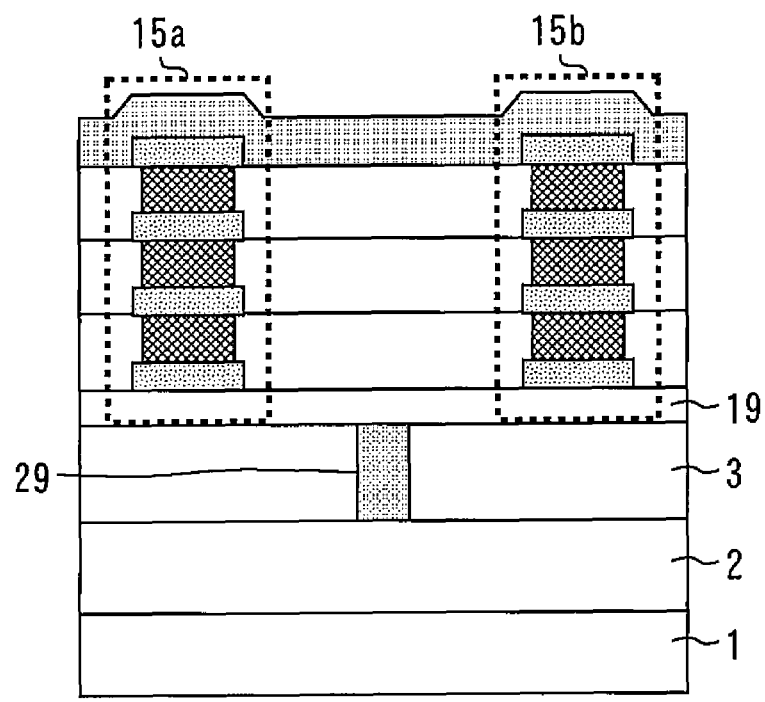
FIG. 14 is a sectional view taken along line I-II in FIG. 13.

FIG. 13 is a plan view of capacitors according to an eighth embodiment of the present invention. FIG. 14 is a sectional view taken along line I-II in FIG. 13. An isolation trench 29 is provided in the active silicon layer 3 between the low-potential electrodes 15a and 17a and the high-potential electrodes 15b and 17b to insulate and separate the active silicon layer 3 below the low-potential electrodes 15a and 17a and the active silicon layer 3 below the high-potential electrodes 15b and 17b from each other.

In the case where no isolation trench 29 is provided, the active silicon layer 3 below the low-potential electrodes 15a and 17a and the active silicon layer 3 below the high-potential electrodes 15b and 17b are continuous with each other and, therefore, the low-potential electrodes 15a and 17a and the high-potential electrodes 15b and 17b are insulated only by the oxide film 19 on the active silicon layer 3. In the present embodiment, the isolation trench 29 also contributes to the insulation and the insulation withstand capacity of the capacitors 15 and 17 can therefore be improved.

Ninth Embodiment

Figure 15:
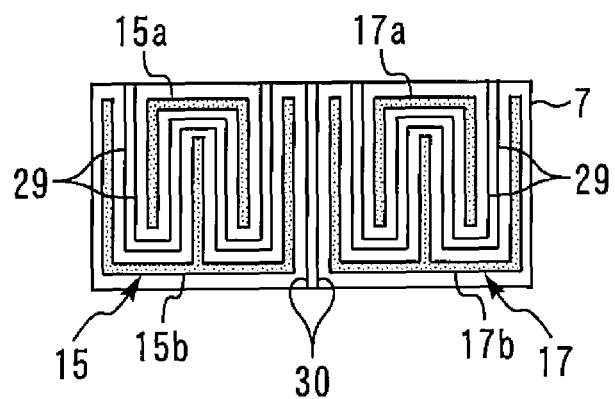
FIG. 15 is a plan view of capacitors according to a ninth embodiment of the present invention.

FIG. 15 is a plan view of capacitors according to a ninth embodiment of the present invention. An isolation trench 30 is provided in the active silicon layer 3 between the capacitor 15 and the capacitor 17 to insulate and separate the active silicon layer 3 below the capacitor 15 and the active silicon layer 3 below the capacitor 17 from each other. The capacitive coupling between the capacitor 15 and the capacitor 17 through the active silicon layer 3 can be weakened thereby, thus enabling prevention of a malfunction due to crosstalk. FIG. 15 illustrates a case where double isolation structures of isolation trenches 29 and 30.

Tenth Embodiment

Figure 16:
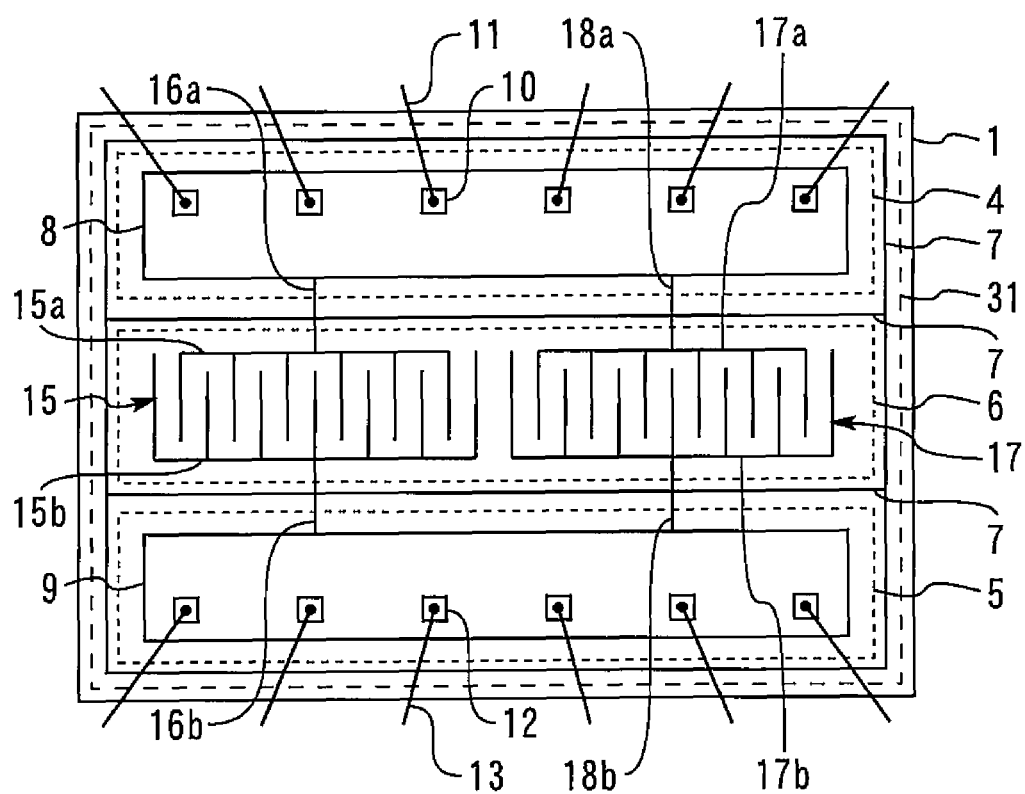
FIG. 16 is a plan view of a semiconductor device according to a tenth embodiment of the present invention.
Figure 17:
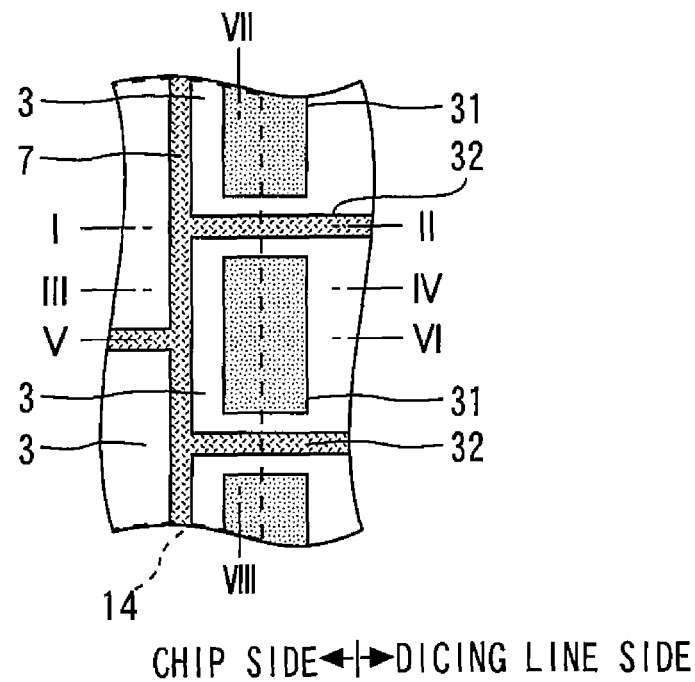
FIG. 17 is an enlarged plan view of an outer peripheral portion of the device shown in FIG. 16.

FIG. 16 is a plan view of a semiconductor device according to a tenth embodiment of the present invention. FIG. 17 is an enlarged plan view of an outer peripheral portion of the device shown in FIG. 16. A plurality of electrode structures 31 are dispersedly disposed along the periphery (dicing line) of the support substrate 1 so as to surround the low-voltage region 4, the high-voltage region 5 and the connection region 6. An isolation trench 32 insulates and separates the plurality of electrode structures 31 from each other. The isolation trench 7 is disposed inside the plurality of electrode structures 31.

Figure 18:
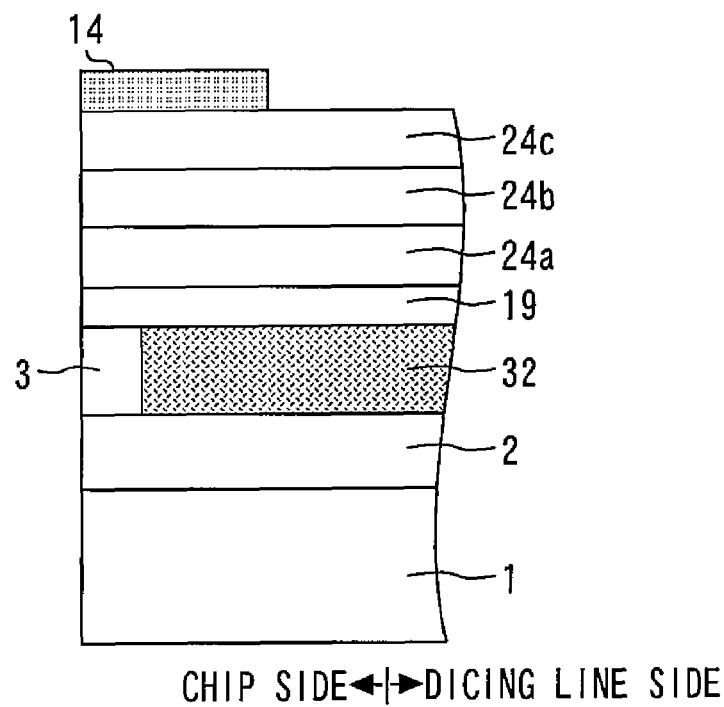
FIG. 18 is a sectional view taken along line I-II in FIG. 17.
Figure 19:
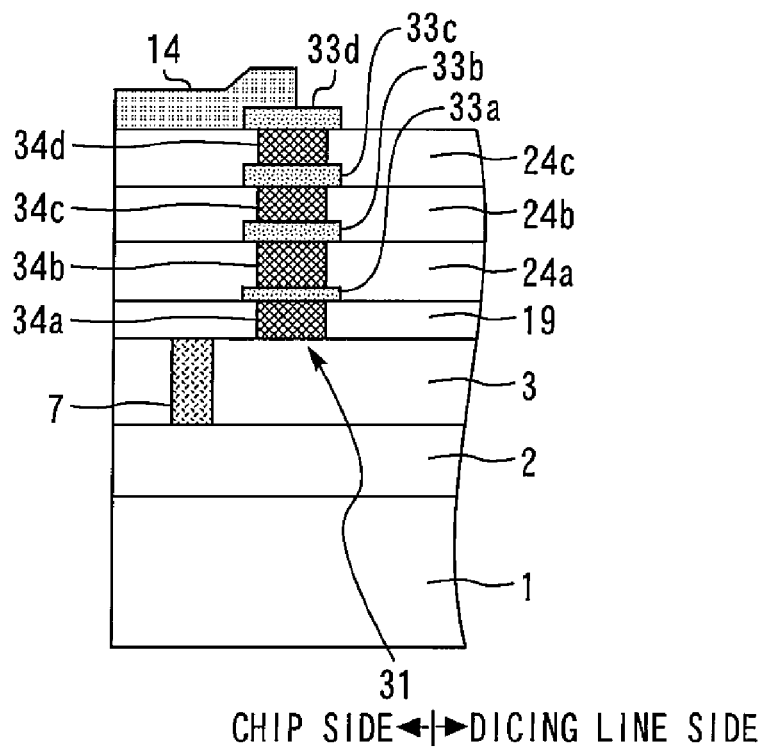
FIG. 19 is a sectional view taken along III-IV in FIG. 17.
Figure 20:
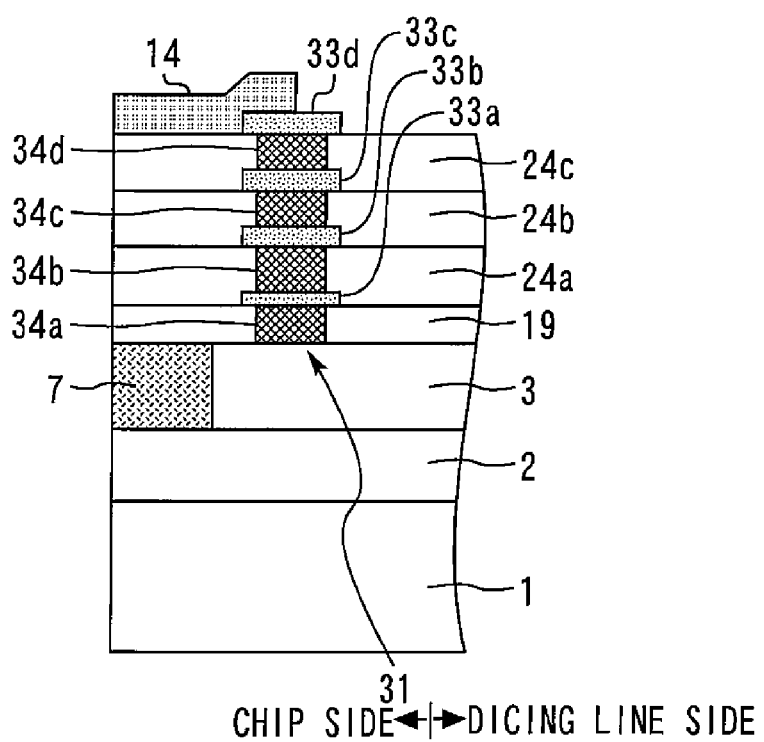
FIG. 20 is a sectional view taken along line V-VI in FIG. 17.
Figure 21:
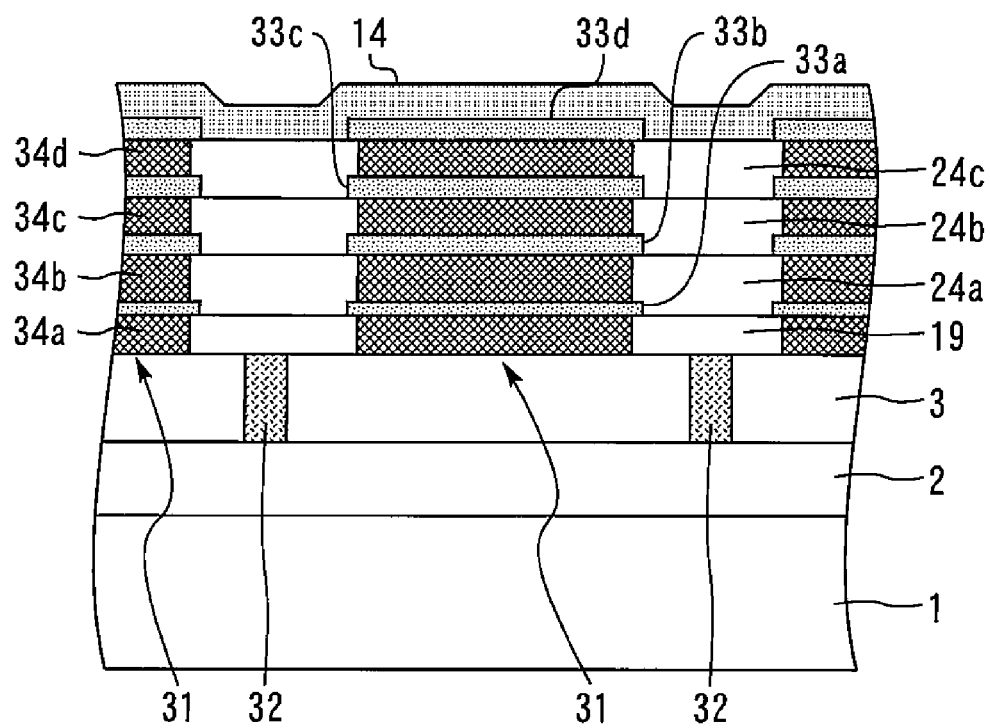
FIG. 21 is sectional view taken along line VII-VIII in FIG. 17.

FIG. 18 is a sectional view taken along line I-II in FIG. 17. FIG. 19 is a sectional view taken along III-IV in FIG. 17. FIG. 20 is a sectional view taken along line V-VI in FIG. 17. FIG. 21 is sectional view taken along line VII-VIII in FIG. 17. Each electrode structure 31 is a multilayer wiring structure having wiring layers 33a to 33d and conductor portions 34a to 34d connecting the wiring layers 33a to 33d one another. The lowermost conductor portion 34a constituting the electrode structure 31 is formed through the oxide film 19 and is in contact with the active silicon layer 3.

While the surface protective film 14 covers the chip surface, a half of the wiring layer 33d as the uppermost layer in the electrode structure 31 on the outer peripheral side of the support substrate 1 (i.e., on the dicing line side) is exposed. The electrode structures 31 prevent a crack or a fracture caused in the active silicon layer 3 at the time of dicing from penetrating the support substrate 1 to mechanically damage the device.

Figure 22:
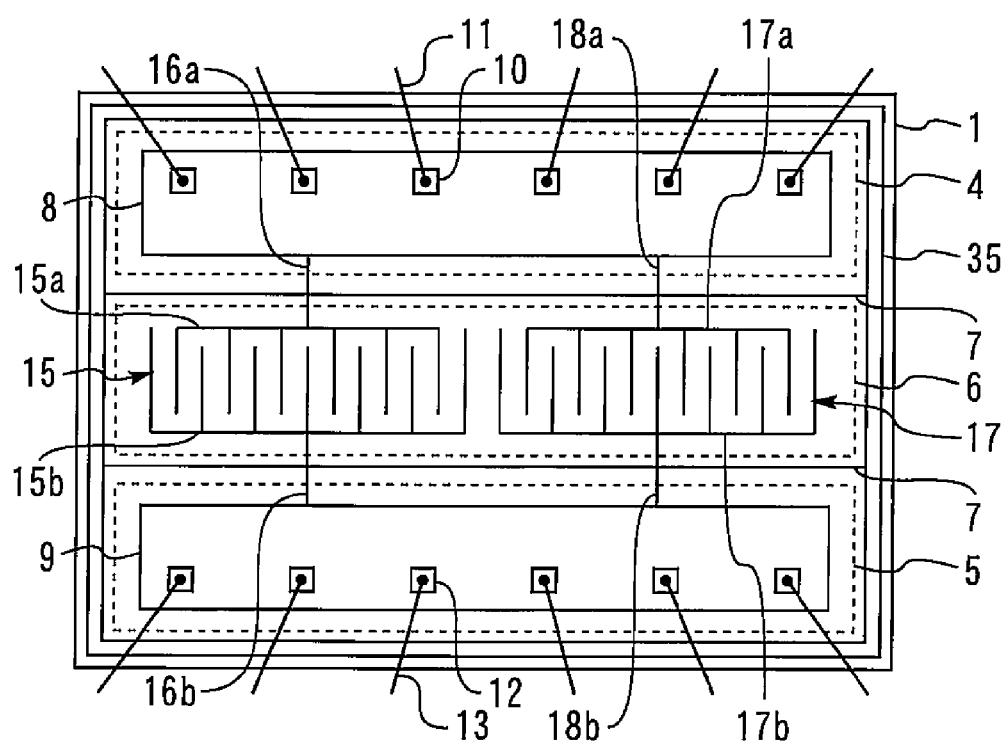
FIG. 22 is a plan view of a semiconductor device according to the comparative example.

The effect in the present embodiment will be described in comparison with a comparative example. FIG. 22 is a plan view of a semiconductor device according to the comparative example. In the comparative example, an electrode structure 35 in the form of a continuous loop surrounds the device on the periphery of the support substrate 1. Therefore, the active silicon layer 3 in contact with the electrode structure 35 on an outer peripheral portion of the support substrate 1 has a uniform potential and may form a current leakage path having electrical conductivity between the low-voltage region 4 and the high-voltage region 5. In the present embodiment, the isolation trench 32 insulates and separates the plurality of electrode structures 31 from each other, thus enabling preventing the active silicon layer 3 on the outer peripheral portion of the support substrate 1 from becoming a current leakage path.

Eleventh Embodiment

Figure 23:
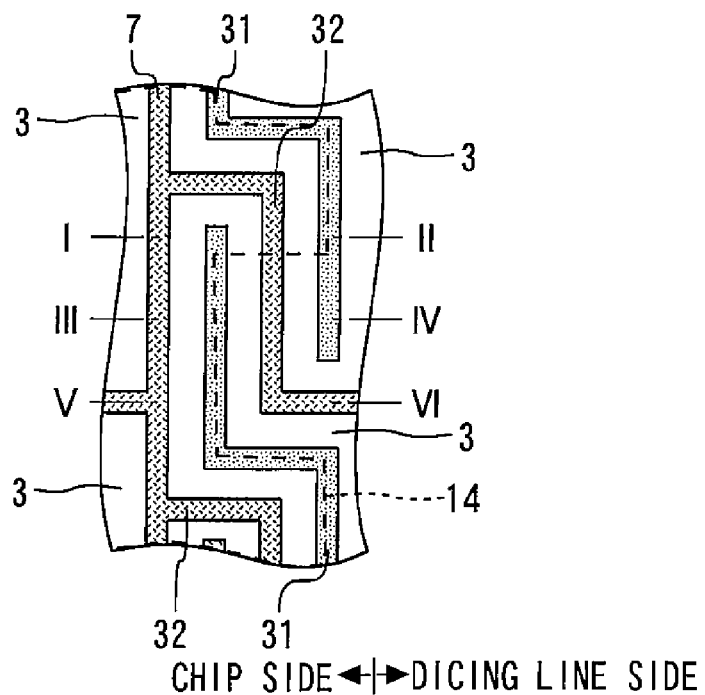
FIG. 23 is an enlarged plan view of an outer peripheral portion of a semiconductor device according to an eleventh embodiment of the present invention.
Figure 24:
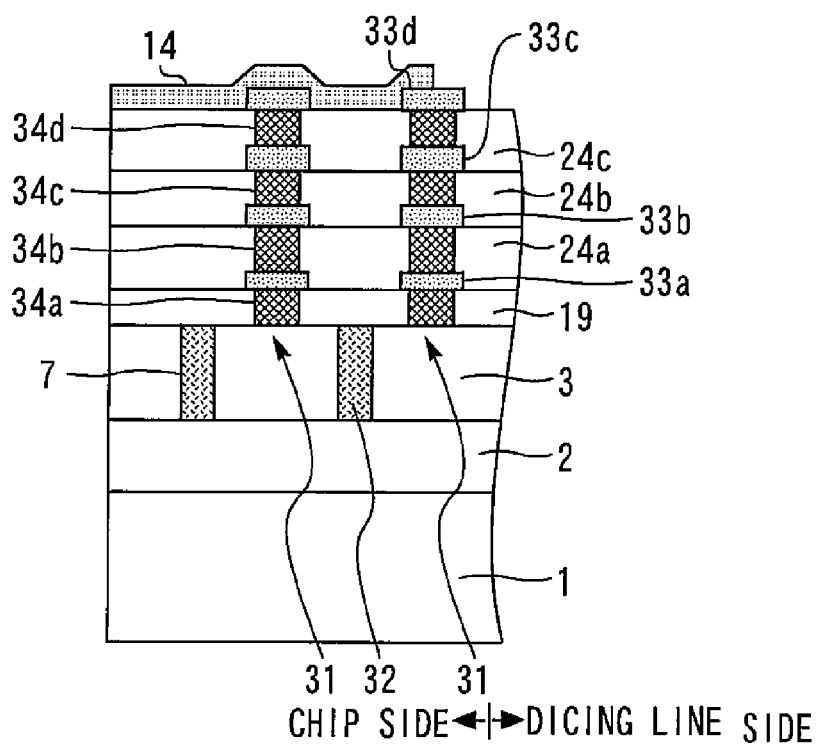
FIG. 24 is a sectional view taken along line I-II in FIG. 23.
Figure 25:
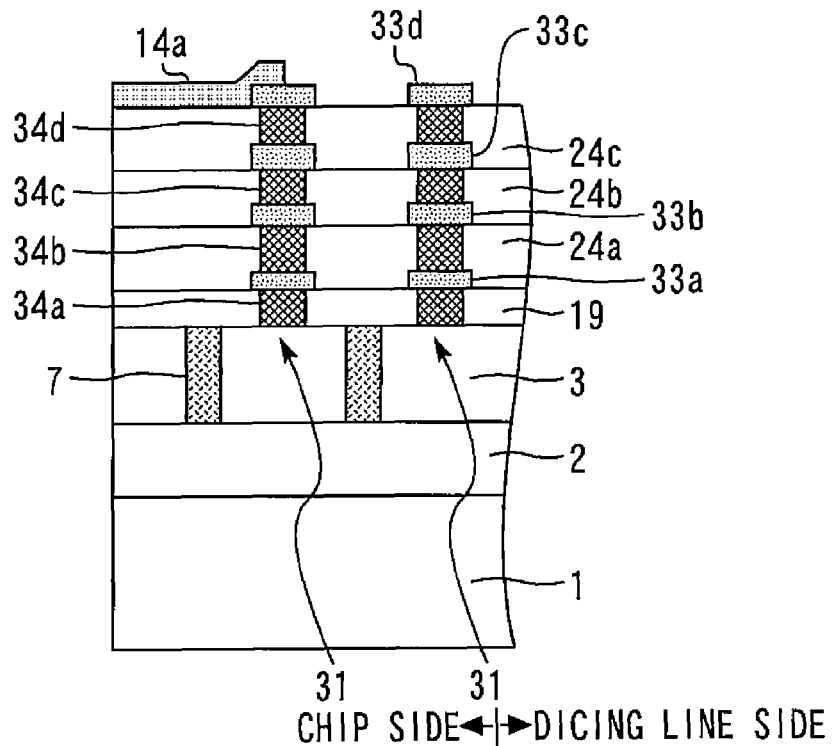
FIG. 25 is a sectional view taken along line III-IV in FIG. 23.
Figure 26:
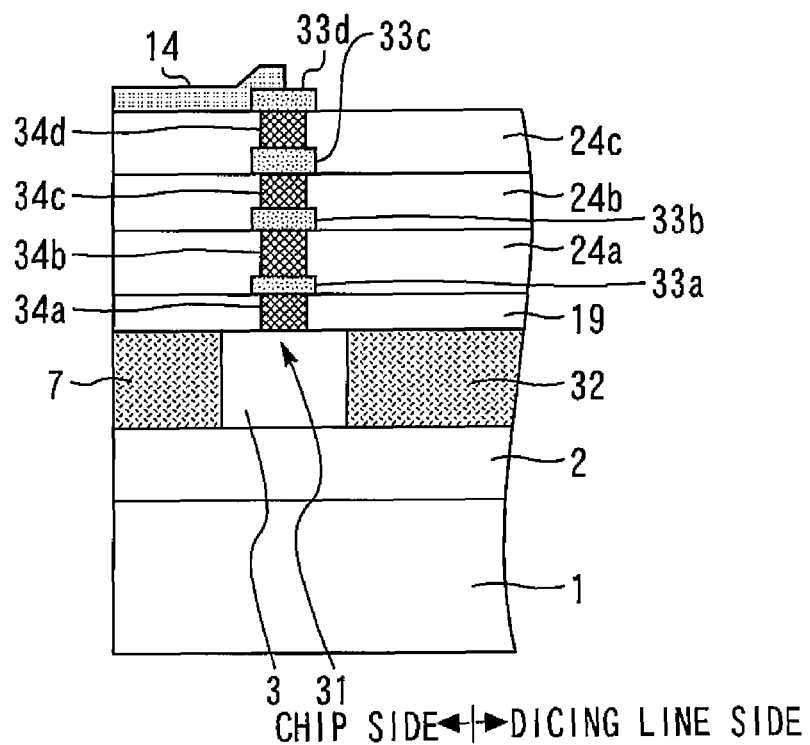
FIG. 26 is a sectional view taken along line V-VI in FIG. 23.

FIG. 23 is an enlarged plan view of an outer peripheral portion of a semiconductor device according to an eleventh embodiment of the present invention. FIG. 24 is a sectional view taken along line I-II in FIG. 23. FIG. 25 is a sectional view taken along line III-IV in FIG. 23. FIG. 26 is a sectional view taken along line V-VI in FIG. 23.

Active silicon layers 3 divided by isolation trenches 32 and electrode structures 31 are bent at intermediate positions, so that each adjacent pair of the electrode structures 31 overlap each other along the periphery of the support substrate 1, thus enabling preventing a crack caused at the time of dicing from penetrating the chip through the space between the electrode structures 31 adjacent to each other.

Twelfth Embodiment

Figure 27:
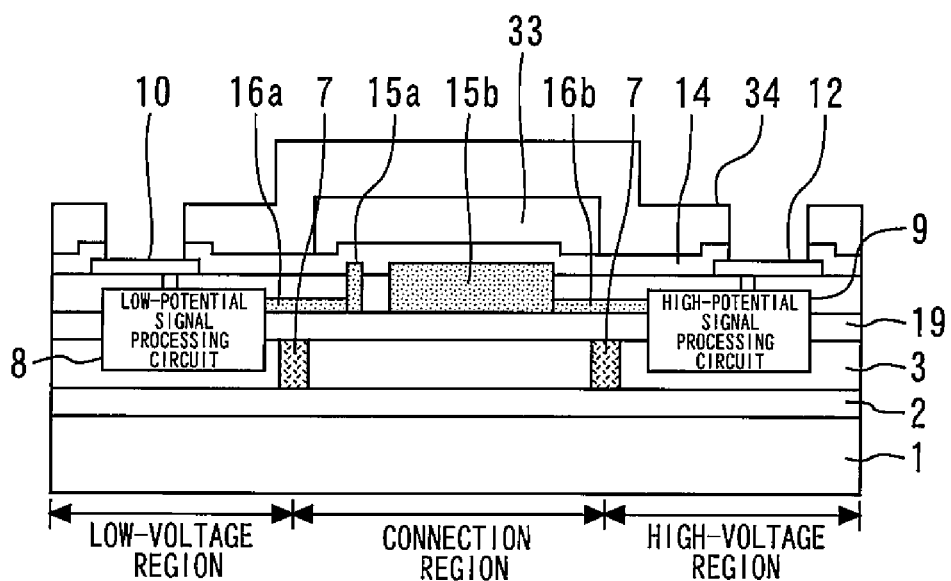
FIG. 27 is a sectional view of a semiconductor device according to a twelfth embodiment of the present invention.

FIG. 27 is a sectional view of a semiconductor device according to a twelfth embodiment of the present invention. In the twelfth embodiment, surface protective films 33 and 34 are provided in addition to the surface protective film 14. The surface protective film 33 covers only the connection region 6. The surface protective film 34 covers the low-voltage region 4, the high-voltage region 5 and the connection region 6.

The low-potential electrodes 15a and 17a and the high-potential electrodes 15b and 17b are disposed with a minimum spacing satisfying an insulation withstand voltage required for obtaining the desired capacitance value. For example, when the withstand voltage class is on the order of 600 V, the spacing is about 10 μm. When the withstand voltage class is on the order of 1200 V, the spacing is about 20 μm. When a high potential difference is applied between the electrodes disposed in such close proximity with each other, there is a possibility of occurrence of discharge at the surface of the surface protective film between the electrodes. To prevent this, the chip surface is coated with a resin coating material such as polyimide. However, there is a limit of about 10 μm to the thickness of the resin coating material in relation to the viscosity. There is also a need to form openings in regions of the pads 10 and 12. It is, therefore, difficult to apply the resin coating material to an increased thickness.

In the present embodiment, therefore, the surface protective film 33 formed of a film of an organic material such as polyimide is first formed by application of the material and patterning is then performed to leave the surface protective film 33 only on the connection region 6. Next, the surface protective film 34 formed of a film of an organic material such as polyimide is formed by application of the material and patterning is performed to form openings on the pads 10 and 12. The surface protective film can be formed to an increased thickness only on the connection region 6 in this way, thus enabling prevention of surface discharge between the electrodes.

Thirteenth Embodiment

Figure 28:
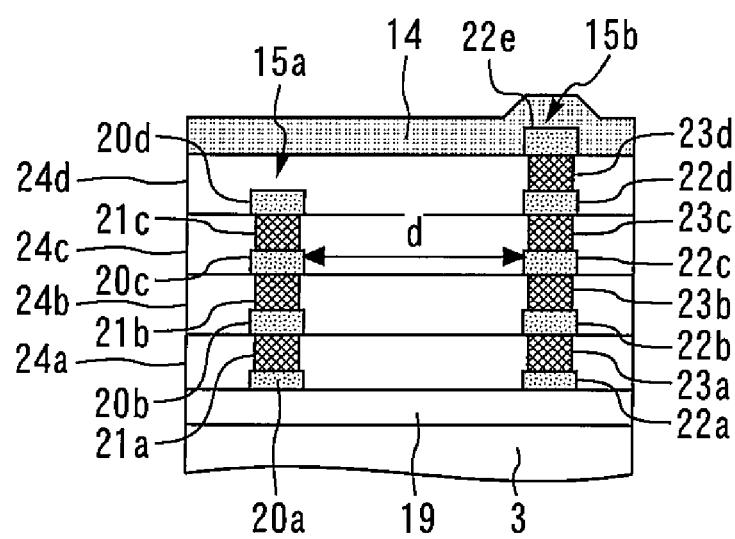
FIG. 28 is a sectional view of a capacitor according to a thirteenth embodiment of the present invention.

FIG. 28 is a sectional view of a capacitor according to a thirteenth embodiment of the present invention. In the thirteenth embodiment, a structure not having the wiring layer 20e and the conductor portion 21d in the uppermost layer of the low-potential electrode 15a in the first embodiment (FIG. 4) is provided. The wiring layers 20a to 20d are smaller in number than the wiring layers 22a to 22e by one or more layers. An upper most layer of the wiring layers 20a to 20d is lower in height than an upper most layer of the wiring layers 22a to 22e. As a result, the effective thickness of the protective film covering the surface of the low-potential electrode 15a is increased, thus enabling prevention of surface discharge.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-178144, filed on Aug. 29, 2013 including specification, claims, drawings and summary, on which the Convention priority of the present application is based, is incorporated herein by reference in its entirety.

What is claimed is:

1. A semiconductor device comprising:
a substrate including an insulating layer;
a semiconductor layer on the insulating layer and including a low-voltage region, a high-voltage region, and a connection region;
a first isolation trench insulating and separating the low-voltage region, the high-voltage region, and the connection region from each other;
a low-potential signal processing circuit in the low-voltage region, operating at a first potential, processing an inputted first signal, and outputting a second alternating current signal;
a high-potential signal processing circuit in the high-voltage region, operating at a second potential higher than the first potential, processing the second alternating current signal, and outputting a third signal; and
a capacitor on the connection region and transmitting the second alternating current signal from the low-potential signal processing circuit to the high-potential signal processing circuit,
wherein the capacitor includes a low-potential electrode connected to the low-potential signal processing circuit, and a high-potential electrode connected to the high-potential signal processing circuit,
the low-potential electrode includes a plurality of first wiring layers which are stacked,
the high-potential electrode includes a plurality of second wiring layers which are stacked,
the first wiring layers and the second wiring layers are capacitively coupled, and
side wall surfaces of the first wiring layers and side wall surfaces of the second wiring layers are opposed to each other.

2. The semiconductor device according to claim 1, wherein the first isolation trench completely surrounds each of the low-voltage region, the high-voltage region and the connection region.

3. The semiconductor device according to claim 1, wherein first isolation trench includes a plurality of isolation trenches multiplied as viewed in plan.

4. The semiconductor device according to claim 3, further comprising a second isolation trench separating the semiconductor layer into a plurality of sections in an insulating manner, wherein each section is located between each adjacent pair of the isolation trenches.

5. The semiconductor device according to claim 1, wherein the low-potential electrodes and the high-potential electrodes are each a member in comb form having a plurality of teeth as viewed in plan, and
the teeth of one of the low-potential electrodes and the high-potential electrodes are wrapped with another of the low-potential electrodes and the high-potential electrodes in three directions as viewed in plan.

6. The semiconductor device according to claim 1, wherein the low-potential electrode includes first and second low-potential electrodes spaced apart from each other,
the high-potential electrode includes first and second high-potential electrodes spaced apart from each other,
the first low-potential electrode and the first high-potential electrode form a first capacitor,
the second low-potential electrode and the second high-potential electrode form a second capacitor, and a shielding electrode connected to a fixed potential is disposed between the first capacitor and the second capacitor.

7. The semiconductor device according to claim 1, wherein the low-potential electrode includes a first conductor portion connecting each adjacent pair of the first wiring layers each other,
the high-potential electrode includes a second conductor portion connecting each adjacent pair of the second wiring layers each other,
a width of the first wiring layer is equal to a width of the first conductor portion, and
a width of the second wiring layer is equal to a width of the second conductor portion.

8. The semiconductor device according to claim 1, wherein the low-potential electrode includes a plurality of first conductor portions connecting each adjacent pair of the first wiring layers each other, disposed at opposite ends of the first wiring layers in a width direction, and spaced part from each other, and
the high-potential electrode includes a plurality of second conductor portions connecting each adjacent pair of the second wiring layers each other, disposed at opposite ends of the second wiring layers in a width direction, and spaced part from each other.

9. The semiconductor device according to claim 1, wherein one of the low-potential electrode and the high-potential electrode has a cornered portion and another of the low-potential electrode and the high-potential electrode has a recessed portion facing the cornered portion, and
the cornered portion and the recessed portion are concentrically rounded as viewed in plan.

10. The semiconductor device according to claim 1, further comprising a third isolation trench insulating and separating the semiconductor layer below the low-potential electrode and the semiconductor layer below the high-potential electrode from each other.

11. The semiconductor device according to claim 1, wherein the low-potential electrode includes first and second low-potential electrodes spaced apart from each other,
the high-potential electrode includes first and second high-potential electrodes spaced apart from each other,
the first low-potential electrode and the first high-potential electrode form a first capacitor,
the second low-potential electrode and the second high-potential electrode form a second capacitor, and
the semiconductor device further comprises a fourth isolation trench insulating and separating the semiconductor layer below the first capacitor and the semiconductor layer below the second capacitor from each other.

12. The semiconductor device according to claim 1, further comprising a plurality of electrode structures dispersedly disposed along a periphery of the substrate and surrounding the low-voltage region, the high-voltage region and the connection region; and
a fifth isolation trench insulating and separating the plurality of electrode structures from each other.

13. The semiconductor device according to claim 12, wherein each adjacent pair of the electrode structures overlap each other along the periphery of the substrate.

14. The semiconductor device according to claim 1, further comprising a first surface protective film covering only the connection region; and
a second surface protective film covering the low-voltage region, the high-voltage region and the connection region.

15. The semiconductor device according to claim 1, further comprising a surface protective film covering the first and second wiring layers,
wherein one of the first wiring layers and the second wiring layers is smaller in number than another of the first wiring layers and the second wiring layers by one or more layers, and
an upper most layer of one of the first wiring layers and the second wiring layers is lower in height than an upper most layer of another of the first wiring layers and the second wiring layers.

\* \* \* \* \*